(12) United States Patent
Schnizlein et al.

(10) Patent No.: US 6,424,274 B1
(45) Date of Patent: Jul. 23, 2002

(54) KEYPAD SCANNING WITH FEW PINS

(75) Inventors: Paul G. Schnizlein; Kenneth Tallo, both of Austin, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/290,139

(22) Filed: Apr. 13, 1999

(51) Int. Cl.[7] .................. H03K 17/94; H03M 11/00
(52) U.S. Cl. ................................. 341/26; 341/22
(58) Field of Search .................... 341/22, 26

(56) References Cited

U.S. PATENT DOCUMENTS

| | | | | |
|---|---|---|---|---|
| 4,015,254 A | * | 3/1977 | Strandt | 341/22 |
| 4,118,700 A | * | 10/1978 | Lenihan | 340/524 |
| 4,583,189 A | | 4/1986 | Koyama | 364/709 |
| 5,057,836 A | | 10/1991 | Inaba | 341/26 |
| 5,521,575 A | | 5/1996 | Pack | 341/26 |

FOREIGN PATENT DOCUMENTS

WO    WO 99/62180    12/1999

* cited by examiner

*Primary Examiner*—Timothy Edwards, Jr.
(74) *Attorney, Agent, or Firm*—Williams, Morgan & Amerson, P.C.

(57) ABSTRACT

The invention is, in its various aspects, an apparatus and a method for scanning a keypad or a keyboard. The apparatus comprises a keypad and an integrated circuit. The keypad includes a plurality of chained resistors and a plurality of key switches. Each of the plurality of key switches is tied to a common node at a first terminal thereof and tapping the chained resistors at a second node thereof. Each of the key switches generates a signal indicative of the respective key switch being pressed when the key switch is pressed. The integrated circuit is capable of receiving the generated signal. The integrated circuit furthermore includes an analog to digital converter capable of generating a reference signal and a circuit capable of determining which key switch has been pressed from the magnitude of the generated voltage signal and the reference signal. The method for scanning a keypad comprises generating a voltage signal whose magnitude indicates which key is being pressed, and determining from the magnitude of the generated voltage signal which key was pressed.

9 Claims, 4 Drawing Sheets

KEYPAD SCANNING WITH FEW PINS

BACKGROUND OF THE INVENTION

1. Field of the Invention

This invention relates to sensing keys on a keypad and, more particularly, a method and apparatus for scanning a keypad or a keyboard using fewer pins than do current techniques.

2. Description of the Related Art

Keyboards and keypads are commonly associated with computing devices. However, they find application in a large variety of non-computing machines, as well. Exemplary, non-computing machines employing keypads include telephones, microwave ovens, and remote control units for consumer electronics. The array of machines employing keyboards and keypads is extensive and diverse, and ranges well beyond the computing machines with which they are commonly associated.

Virtually all these machines, both the computing and the non-computing, employ the same technique for determining when and which keys have been pushed. FIG. 1 depicts one implementation of this technique. Typically a switch matrix 10 is constructed, and the key switches 12 are placed at the intersections of rows 14 and columns 16. Each key switch 12 is a key and the switch matrix is the keyboard or keypad. Each key switch 12 is normally open, i.e., the key is not pushed, until it is closed when it is depressed, i.e., the key is pushed or pressed.

The machine associated with the switch matrix 10 determines whether a key has been pushed by "interrogating" the keys. The interrogation is typically conducted by an integrated circuit (not shown) that frequently, though not always, is programmable. The switch matrix 10 communicates with the integrated circuit through the integrated circuit's pins. Pins are the typical interface between the internal circuitry of the integrated circuit and the circuitry with which the integrated circuit must interface. For instance, the integrated circuit's circuitry must be powered, and the power is provided externally from a power supply that transmits a power signal to the internal circuitry through one of the integrated circuit's pins.

Returning to FIG. 1, the keys 12 are interrogated by sending words, i.e., groups of digital 1s and 0s, to writable and readable registers (not shown) that control the integrated circuit's pins (not shown). For example, the integrated circuit might write all 0s to the outputs of the rows 14 and read the inputs from the columns 16. If they are all high, i.e., a digital 1, no key is pushed. If any one is low, i.e., a digital 0, then at least one key is pushed. Often, some kind of protection is given in case more than one key is pushed at the same time. That could result in a conflict on a column, if one row is driving low and a different row is driving high, and both rows are connected to a certain column. In the implementation of FIG. 1, the drive to high is made resistive, so that excessive current will not flow.

This prior art key sensing scheme is effective at finding which key is pushed. However, it requires the integrated circuit to dedicate a number of pins on the order of (2× (square_root N), where N is the number of keys, solely for the purpose of determining whether a key has been pushed and identifying which key it is. The pin count is important because each pin costs money. If the integrated circuit is assembled into a package, usually the package cost goes up with the number of pins. An increased number of pins also increases design difficulty for an integrated circuit, which raises the cost of the integrated circuit when it is produced. Even if the integrated circuit is not packaged, each pin requires drivers and protection devices on the silicon, which take up die area, and also costs money.

Thus, there is a need for a new technique for determining whether a key on a keypad or a keyboard has been pushed and for identifing that key. The present invention is directed to resolving one or all of the problems mentioned above.

SUMMARY OF THE INVENTION

The invention is, in its various aspects, an apparatus and a method for scanning a keypad or a keyboard. The apparatus comprises a keypad and an integrated circuit. The keypad includes a plurality of chained resistors and a plurality of key switches. Each of the plurality of key switches is tied to a common node at a first terminal thereof and tapping the chained resistors at a second node thereof. Each of the key switches generates a signal indicative of the respective key switch being pressed when the key switch is pressed. The integrated circuit is capable of receiving the generated signal. The integrated circuit furthermore includes an analog to digital converter capable of generating a reference signal and a circuit capable of determining which key switch has been pressed from the magnitude of the generated voltage signal and the reference signal. The method for scanning a keypad generating a voltage signal whose magnitude indicates which key is being pressed, and determining from the magnitude of the generated voltage signal which key was pressed.

BRIEF DESCRIPTION OF THE DRAWINGS

The invention may be understood by reference to the following description taken in conjunction with the accompanying drawings, in which like reference numerals identify like elements, and in which.

Figure 1:
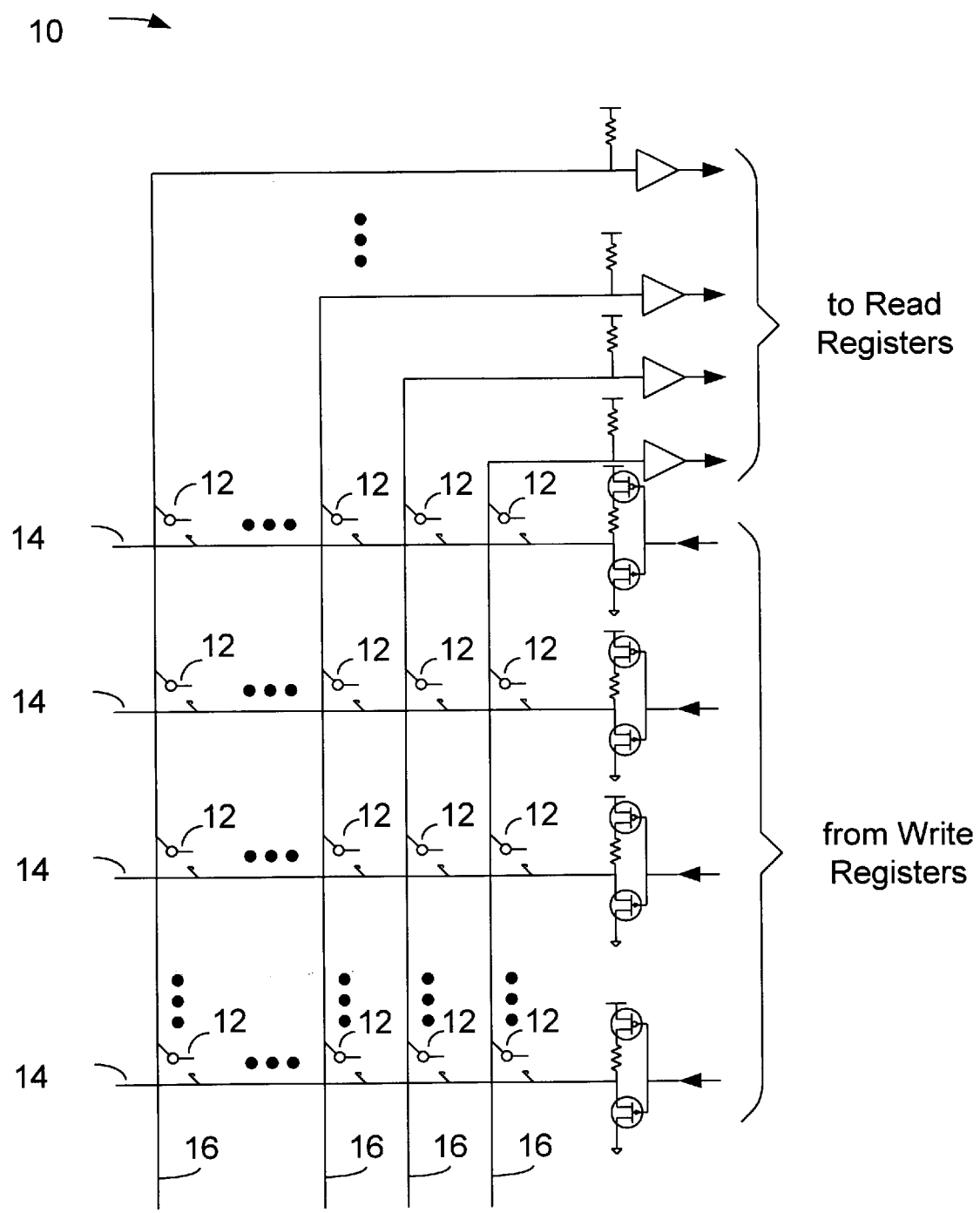
FIG. 1 illustrates a conventional approach to scanning a keyboard or keypad to determine whether and key has been pushed and, if so, determining which one.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The invention manifests itself in at least two aspects. In a first aspect, the invention is an apparatus, comprising a keypad and an integrated circuit. The keypad includes a plurality of chained, passive components, typically resistors. However, the invention is not so limited, as other types of passive components, such as capacitors and inductors may be employed The keypad also includes a plurality of key switches. Each of the plurality of key switches is tied to a common node at a first terminal thereof and taps the chained passive components at a second node thereof, each of the key switches generating a signal indicative of the respective key switch being pressed when the key switch is pressed. The integrated circuit is capable of receiving the signal generated by the keypad and includes an analog to digital ("A/D") converter and a circuit. The A/D converter is capable of generating a reference signal. The circuit is capable of determining which key switch has been pressed from the magnitude of the generated voltage signal and the reference signal. In a second aspect, the invention is a method for scanning a keypad. The method generally comprises generating a voltage signal whose magnitude indicates which key is being pressed and determining from the magnitude of the generated voltage signal which key was pressed.

Figure 2A:
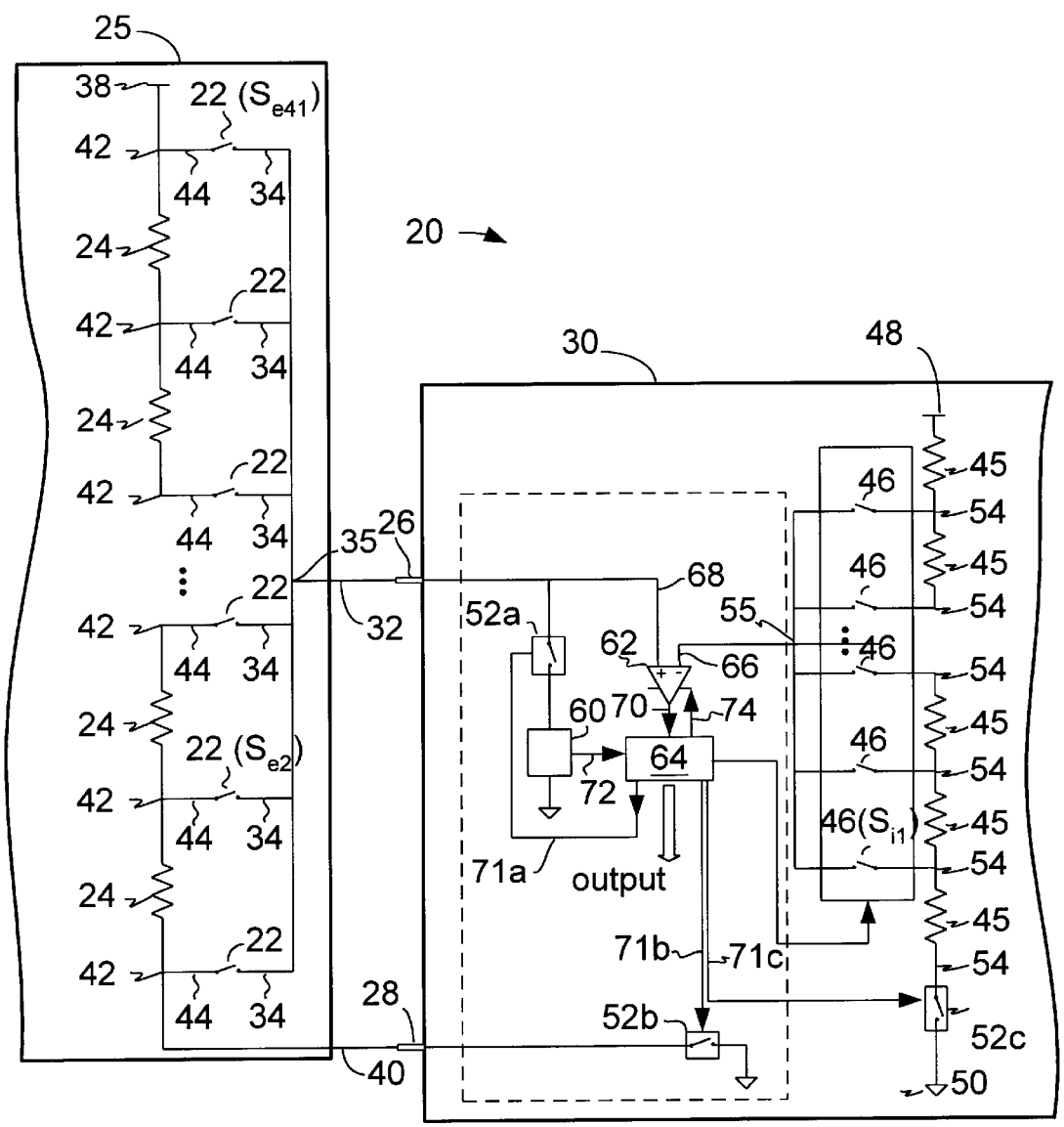
FIGS. 2A–2C illustrate a first particular implementation of an apparatus constructed and operated in accordance with the present invention.
Figure 2B:
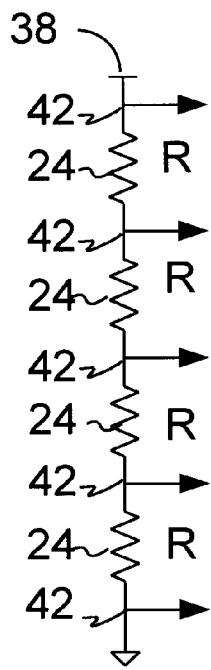
Figure 2C:
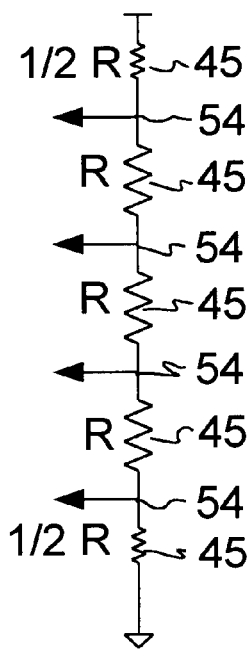

Both aspects of the invention admit to wide variation, all within the scope and spirit of the invention. To engender a fuller understanding and appreciation of the invention, two embodiments embodying both these aspects are disclosed. The first embodiment 20 is illustrated in FIGS. 2A–2C. The second embodiment 80 is illustrated in FIGS. 3–7. Each shall be discussed in turn.

FIG. 2A illustrates a particular embodiment 20 of the present invention in which it may be determined how many and which of the key switches 22 of the keyboard or keypad 25 are pressed using only two pins 26 and 28 of the integrated circuit ("IC") 30. Technically, there may be some difference between a keypad and a keyboard. A keypad usually has numeric keys whereas a keyboard usually employs alpha-numeric keys. Keyboards also typically include a keypad. Thus, the principal differences between a keypad and a keyboard are the number and the type of keys. These differences, however, are immaterial to the present invention. Henceforth, the term "keypad" will be used to generically encompass both keyboards and keypads in this disclosure.

The implementation 20 of FIG. 2A employs only the two pins 26 and 28 of the IC 30 for a relatively large number N of key switches 22 on the keypad 25. In some variations of this embodiment, only a single pin is necessary as is described below. The number N of key switches 22 is implementation specific. In one particular embodiment of the implementation 20, the number of keys is 41, but the number N of key switches 22 may exceed 100 in alternative embodiments if desired. Hereafter, the number of keys shall be referred to as N. For the sake of clarity, FIG. 2A only depicts six key switches 22, but it is to be understood that the invention is not so limited.

Referring more particularly now to FIG. 2A, the keypad 25, includes a plurality of N key switches 22 and a plurality of N–1 resistors 24. Each of the N key switches 22 is tied to a first voltage line 32 at a first terminal 34 thereof at a common node 35. The plurality of N–1 resistors 24 are configured in series across a first known electrical potential defined by a first high voltage 38 and a second voltage line 40. In one particular embodiment, each of the resistors 24 is rated for the same resistance. Note that the first voltage line 32 is electrically connected to the pin 26 and the second voltage line 40 is electrically connected to the pin 28 of the IC 30. Although other embodiments might utilize more pins on IC 30, the particular embodiment of the implementation illustrated in FIG. 2A employs only two. This is significant improvement over the number that would be required under the conventional approach illustrated in FIG. 1 and discussed above.

Returning to FIG. 2A, each of the resistors 24 has a tap point 42 on either side thereof. Each tap point 42 is electrically connected to a second terminal 44 of a respective one of the N key switches 22. The N–1 resistors 24 may therefore be said to comprise a "resistor divider chain" divided by the key switches 22 at the tap points 42.

The integrated circuit 30 includes a plurality of N resistors 45. The N resistors 45 are connected in series across a second known electrical potential defined by a second high voltage 48 and a low voltage 50, which in the particular embodiment illustrated is ground. Each pair of the plurality of N resistors defines a tap point 54 therebetween. The IC 30 also includes a second plurality of N switches 46, a first terminal of each one of the N switches 46 is electrically connected to a respective tap point 54 defined by the plurality of N resistors 45.

Figure 4:
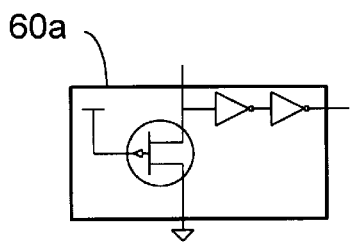
FIG. 4 illustrates one particular embodiment of a current sensor employed in the embodiment of FIGS. 2A–2C.

The IC 30 furthermore comprises a first control switch 52a, a second control switch 52b, a third control switch 52c, a current sensor 60, a comparison circuit 62, and a control circuit 64. The first control switch 52a is electrically connected to the first voltage line 32 at one terminal thereof. The second control switch 52b is electrically connected to the second voltage line 40 at one terminal thereof and to the low voltage 50 at a second terminal thereof. The current sensor 60 is electrically connected to a second terminal of the first control switch 52a and is capable of sensing a current generated when the first control switch 52a is closed and outputting a first data signal indicative thereof. FIG. 4 illustrates one particular embodiment 60a for the current sensor 60. In FIG. 4, a very high resistance n-channel, field effect transistor ("nFET"), when any current flows through it, will produce a voltage drop big enough to cross the trip point of the inverter. The third control switch 52c connects the chained resistors 45 to ground when closed. Note that the control switches 52a–c are optional and might not be employed in all embodiments.

The comparison circuit 62 includes a first input 66 electrically connected to a second terminal of each one of the second plurality of N switches 46 through the common node 55 and a second input 68 electrically connected to the first voltage line 32. The comparison circuit 62 is capable of outputting a second data signal responsive to the comparison of a first input signal and a second input signal. Finally, the control circuit 64 is capable of receiving the first and second data signals and outputting, responsive thereto, a signal indicating which key switch has been pressed. Also responsive to the first and second data signals, the control circuit 64, in the particular embodiment illustrated, is capable of generating: control signals to operate the second plurality of N switches 46 and the control switches 52a–c on the respective lines 71a–c. In embodiments omitting the control switches 52a–c, the control circuit 64 may omit the capability for generating control signals for the control switches 52a–c.

In one particular embodiment, there are N−1 equal valued resistors 24 on the keypad 25 in a chain from $V_{cc}$ (the voltage 38) to $V_{fg}$ (the voltage on the voltage line 40), $V_{jg}$ also being a chip pin 28. The key switches 22 are connected to tap points 42 in this divider chain and are connected at the other end to the common node $V_s$ (node 35), $V_s$ being the pin 26 to the IC 30. Internal to the IC 30, there is a second resistor divider chain comprised of the equivalent of N equal valued resistors 45. The second resistor chain is tapped differently from the first resistor chain. The N−1 internal switches 46 connect the taps 54 to the common node $V_i$ (the node 55).

The common node $V_i$ (common node 55) is connected to one input 66 of the voltage comparator 62 and the common node $V_s$ (node 35) is connected to a second input 68 of the voltage comparator 62. The output 70 of the voltage comparator 62 indicates whether the board voltage $V_s$ is higher than the internal voltage $V_i$. This output 70 is connected to a block of logic 64 that controls all the internal switches 46, as well as the control switches 52a, 52b and 52c. The control switch 52a conditionally connects the node $V_s$ (node 35) to the current sensor 60. When current flows in the current sensor 60, a logical 1 is transmitted to the logic block 64 on its input line 72, indicating that a key switch 22 has been pushed.

The particular implementation 20 in FIG. 2A includes optional control switches 52a–c that provide control over power consumption. For instance, the control switch 52c, when closed, connects the resistors 45 to ground and, when open, disconnects the resistors 45 from ground. These control switches 52a–c may be omitted in some embodiments. Each of the switches 52a–c is controlled, in the particular embodiment illustrated, by the block of logic 64 as described further below. In embodiments omitting the control switch 52b, the resistor chain in the keypad 25 may be directly grounded, thereby eliminating the need for the second pin 28.

Operation begins with the control switch 52b open, so that no current flows in the resistor string. The control switch 52a is set to 1, to connect the current sensor to $V_s$. The control switch 52c is set to 0, so that the internal resistor chain is disconnected from ground. Finally, enable line 74 is set to 0 so that the comparator is off and dissipates no power. In this initial condition, no current flows, so no power dissipates until a key switch 22 is pushed.

When a key switch 22 is pushed, current flows in the current sensor 60, and the "key pushed" input on line 72 changes to 1. Assume the key switch 22, also labeled as $S_{e2}$, was pressed, for instance. The logic block 64 then begins following sequence. The control switch 52b closes, so that ground is connected to the bottom of the resistor string on the board and current flows through the resistors 24. The third control switch 52c is then closed, so that current flows in the internal resistor string comprised of the resistors 45. The signal on the line 74 is set to 1, thereby enabling the comparator 62. The control switch 52a is then opened, removing the path through the current sensor 60.

The first switch 46, also labeled $S_{i1}$, is closed, thereby connecting the lowest voltage tap of the internal string onto the comparator 62's input 66. If the comparator 62 outputs a 1 on the line 70, the voltage generated by the keypad 25 is higher than that generated by the internal resistor chain on the line 66. This indicates that the pushed key switch 22 has not yet been identified. The process then tests the next switch 46, i.e., opens the first switch 46 and closes the second switch 46, also labeled $S_{i2}$, and again examines the state of the comparator 62's output 70. In the case of $S_{e2}$ assumed above, on closing the second switch 46, the comparator 62's output 70 will go low, because now the voltage on the line 68 is lower than the voltage on the line 66. Because it was second switch 46 that caused this, it can be deduced that $S_{e2}$ was the key switch 22 pressed on the keypad 25.

If a different key switch 22 was pressed, the process continues closing the switches 46 one at a time while monitoring the comparator 62's output 70. Eventually, the output 70 would go low, and the number of the switch 46 that caused that will be the number of the key switch 22 that is closed. There is an exception in the case of the last, or highest key switch 22, also labeled $S_{e41}$, is pushed. In that case, even after closing each switch 46, the output 70 will still be high, whereupon it can be deduced that the remaining switch $S_{e41}$ was pressed.

FIGS. 2B and 2C show how to choose the taps on the internal resistor string of resistors 45. The examples in FIGS. 2B–2C show an external string of only four resistors 24, 45, respectively, for the sake of clarity. Larger numbers like 40 or 60 are easily feasible, and the limit is determined by how fine of voltages the voltage comparator can discern, and by what tolerance of resistor matching can be achieved on external and internal resistors 24, 45, respectively. In this particular embodiment, each of the resistors 24 has the same value (i.e., R), although the invention is not so limited. The voltages on the internal string are selected to be midway between the voltages possible on the external taps. This is accomplished when the resistors 45 at the top and bottom ends of the internal string are half the value (i.e., ½ R) of those in the middle of the string (i.e., R). This sets the voltages midway between the external voltages, for reliable sensing, and diminishes the requirements on the comparator. The technique can also be scaled down as needed.

The present invention offers numerous advantages over conventional techniques. Besides the previously stated advantage of using only one or two chip pins, this technique has an advantage regarding key resistance. Many keypads use cheap key switches. Cheap key switches used often develop significant resistance of their own over their lifetime, and the closed key switch can present as much as 1–2 KΩs resistance. Because of the high input impedance of the comparator 62, this embodiment is insensitive to this key switch resistance, and can yield the correct answer even if the resistance is over 100 KΩs.

This embodiment also performs well relative to power dissipation. No power dissipates until a key switch 22 is pushed, and then the dissipation is dominated by the resistor string. For instance, if an individual resistor 24 is 5 KΩs, a string of forty resistors 24 is 200 KΩs, and the implementation 20 draws 15 $\mu$A from a 3V supply. Higher values are possible, limited only by the leakage current on the keypad 25.

Precautions may be taken to correctly identify the pressed key where more than one key switch 22 is accidentally pressed. If the key switches 22 are positioned close together, the implementation 20 may report correctly about only one of them. If the key switches 22 are separated, the implementation 20 may report incorrectly because the resultant voltage might look like a different key switch 22. One approach to this dilemma interrogates after a key switch 22 is detected and does not accept any new information until all of the key switches 22 have been released for some predetermined time. This approach often works because usually the second key switch 22 is pushed later, as the finger rolls a bit off of its intended target. Another approach arranges the resistor string on the keypad 25, so that the key switches 25 that are likely to be pushed together are adjacent on the resistor string 27. When the two resistors 24 associated with the pushed key switches 22 are adjacent to each other, one of the key switches 22 will be detected correctly.

Figure 3:
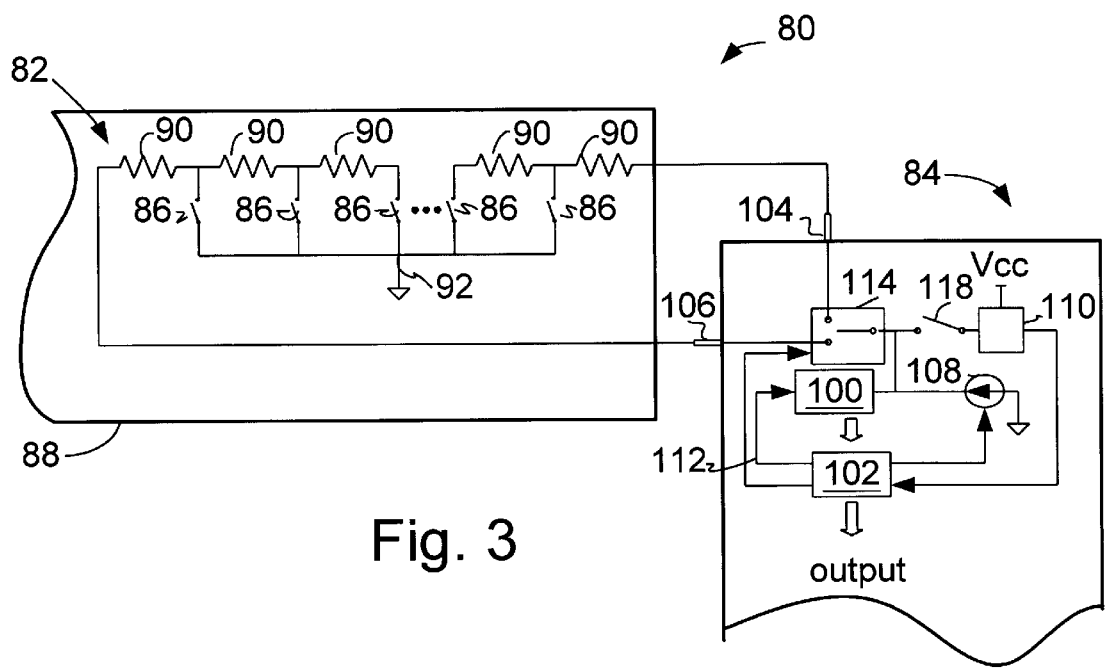
FIG. 3 illustrates a second particular implementation of an apparatus constructed and operated in accordance with the present invention.

FIG. 3 illustrates a second embodiment 80 of the present invention. The implementation 80 of FIG. 3 is, in some respects, more complicated than the implementation 20 of FIG. 2 in that it employs more elements and current sources. However, the additional complexity allows some embodiments to determine which key switch has been pressed with only a single pin. In the embodiment 80 illustrated, however, a redundant determination of which key switch 86 has been pressed is made, thus utilizing a second pin 106. If the redundant check is omitted, the determination can be made with only the single pin 104, as is discussed more fully below.

This approach ties the ends of the resistor string 82 to the IC 84's pins 104 and 106, the common side of the key switches 86 being grounded. The embodiment 80 includes a keypad 88. The keypad 88 comprises a plurality of chained resistors 90 in series across a known electrical potential and a plurality of key switches 86. Each of the key switches 86 is tied to a common node 92 at a first terminal thereof and tap the chained resistors 90 at a second node thereof. Each of the key switches 86 generates a signal indicative of the respective key switch 86 being pressed when the key switch 86 is pressed. In the particular variation of the embodiment 80 illustrated in FIG. 3, two signals are actually generated, one each on the lines 98a–b as discussed more fully below. The IC 84 is capable of receiving the signal(s) generated by the key switches 86 of the keypad 88. The IC 84 includes an analog to digital converter 100 capable of generating a reference signal and a circuit 102 capable of determining which key switch 86 has been pressed from the magnitude of the generated voltage signal and the reference signal.

More particularly, the keypad 88 includes a first plurality of N key switches 86, each of the first plurality of N key switches 86 tied to a low voltage at a first terminal thereof. The keypad 88 also includes a plurality of N+1 resistors 90 in series between a first pin 104 and a second pin 106. Each pair of the plurality of N+1 resistors 90 defines a tap point therebetween and each tap point is electrically connected to a second terminal of a respective one of the first plurality of N key switches 86. The IC 84 includes the A/D converter 100, the logic circuit 102, a current source 108, and a current sensor 110.

In operation, the switch 114 is initially closed to the pin 104 and the switch 118 is closed. When a key switch 86 closes, the current sensor 110 detects a current flowing from $V_{cc}$. This signal is sent to the logic circuit 102, which then disconnects the current sensor 110 from $V_{cc}$, and turns on the current source 108. The A/D converter 100 converts the voltage on the pin 104 to a digital word in response to a "convert" command from the logic circuit 102 on the line 112. The digital word corresponds to the measured resistance in the resistor string 82, from the pin 104 to ground ($R_{P1}$). This resistance $R_{P1}$ indicates which key switch 86 was pressed.

In one particular embodiment, a check is performed on the determination of which key switch 86 was pressed. In this embodiment, the logic circuit 102 closes the switch 114 to the pin 106. The procedure described immediately above is repeated to find the resistance from the pin 106 to ground ($R_{P2}$). This resistance also implies which key switch 86 was pressed, and is independent from the $R_{P1}$ measurement.

Both measurements should find the same key switch down. Otherwise, more than one key switch 86 has been pushed. Put another way, the sum of $R_{P1}$ and $R_{P2}$ should equal the total resistance of the string 82, or more than one key switch 86 has been pressed. When more than one key switch 86 has been pressed, the logic circuit 102 can inhibit reporting, until it sees only one key switch 86 is pressed. Note, however, that embodiments omitting this check can also omit the pin 106, such that some embodiments can determine which key switch 86 is pressed using only a single pin.

Figure 5:
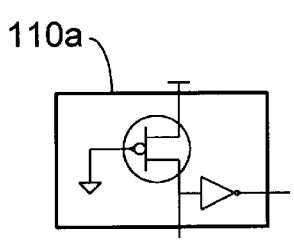
Figure 7:
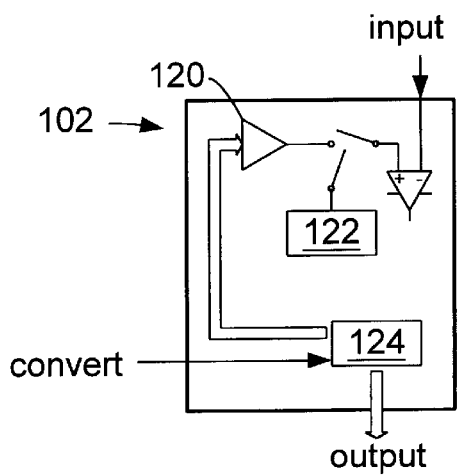

The A/D converter 100, logic circuit 102, current source 108, and current sensor 110 may be any design known to the art suitable for this application. An exemplary embodiment 110a of the current sensor 110 is illustrated in FIG. 5. FIG. 7 illustrates one implementation of the logic circuit 102, including a digital to analog converter 120, a fixed voltage reference 122, and some successive approximation logic 124. Designs for these elements are well known in the art, and the suitability of various alternatives will become apparent to those skilled in the art having the benefit of this disclosure.

Figure 6:
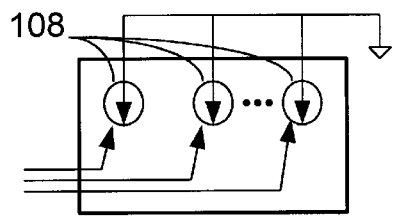
FIGS. 5–7 illustrate particular implementations for various elements in the second embodiment of FIG. 3.

Some alternative embodiments may choose to use multiple current sources 108, and turn them on with control signals as shown in FIG. 6. This technique can help with the otherwise large range of voltages some embodiment may need to convert. The more different currents an implementation uses, the fewer the voltages that need to be produced by the A/D converter 100 needs to produce. Typically, most embodiments employ at least two, and probably several, current sources 108.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
    a keypad, including:
        a plurality of chained, passive components in series across a known electrical potential; and
        a plurality of key switches, each of the plurality of key switches tied to a common node at a first terminal thereof and tapping the chained passive components at a second node thereof, each of the key switches generating a signal indicative of the respective key switch being pressed when the key switch is pressed; and
    an integrated circuit capable of receiving the generated signal, the integrated circuit including:
        means for identifying a pushed key from a voltage signal generated by the keypad and received over the first voltage line, the voltage signal having a magnitude indicative of which key switch is being pressed, and generating an output signal indicating the identification; and
        a control circuit capable of receiving the output signal and capable of, in response thereto, generating a fist control signal to operate a second plurality of N key switches.

2. The apparatus of claim 1, wherein the identifying means comprises:
   a current sensor electrically connected to the common node, the current sensor being capable of sensing a current generated when one of the key switches is closed and outputting a first data signal indicative thereof; and
   a comparison circuit, including a first input tied to a second terminal of each one of the second plurality of N key switches and a second input electrically connected to the first voltage line, the comparison circuit being capable of outputting a second data signal responsive to the comparison of the first input and the second input.

3. The apparatus of claim 1, wherein:
   the first plurality of key switches, includes N key switches and the common node is tied to a first voltage line; and
   the plurality of chained, passive components includes N−1 passive components, each of the plurality of N−1 passive components having a tap point on either side thereof, each tap point being electrically connected to a second terminal of a respective one of the N key switches.

4. The apparatus of claim 1, wherein:
   the plurality of key switches includes N key switches, each of the N key switches being tied to a first voltage at the first terminal thereof through the common node; and
   the plurality of chained, passive components includes N+1 passive components, each pair of the N+1 passive components defining a tap point therebetween, each tap point being electrically connected to a second terminal of a respective one of the of N key switches.

5. The apparatus of claim 1, wherein:
   the means for identifying the key that is pushed includes:
      a current sensor electrically connected to the common node, the current sensor being capable of sensing a current generated when one of the key switches is closed and outputting a first data signal indicative thereof;
      a comparison circuit, including a first input tied to a second terminal of each one of the second plurality of N key switches and a second input electrically connected to the first voltage line, the comparison circuit being capable of outputting a second data signal responsive to the comparison of the first input and the second input; and
   the control circuit is further capable of receiving the first and second data signals and capable of, in response thereto, generates the indication of which key switch has been pressed.

6. The apparatus of claim 1, wherein the passive components are resistors.

7. An apparatus, comprising:
   a keypad, including:
      a first plurality of N key switches, each of the first plurality of N key switches tied to a first voltage line at a first terminal thereof; and
      a plurality of N−1 resistors in series between a first voltage and a second voltage line, each of the plurality of N−1 resistors having a tap point on either side thereof, each tap point being electrically connected to a second terminal of a perspective one of the first plurality of N key switches; and
   an integrated circuit, including:
   a plurality of N resistors in series across a known electrical potential, each pair of the plurality of N resistors defining a tap point therebetween;
   a second plurality of N key switches, a first terminal of each one of the second plurality of N key switches being electrically connected to a respective tap point defined by the plurality of N resistors;
   means for identifying a pushed key from a voltage signal generated by the keypad and received over the first voltage line, the voltage signal having a magnitude indicative of which key switch is being pressed, and generated an output signal indicating the identification; and
   a control circuit capable of receiving the output signal and capable of, in response thereto, generating a first control signal to operate the second plurality of N key switches.

8. The apparatus of claim 7, wherein the integrated circuit includes at least one of:
   a first control switch electrically connected between the plurality of N resistors on the keypad and a low voltage;
   a second control switch electrically connected between the first voltage line and the identifying means; and
   a third control switch electrically connected in series between the plurality of N−1 resistors and the low voltage.

9. The apparatus of claim 7, wherein the identifying means comprises:
   a current sensor electrically connected to the common node, the current sensor being capable of sensing a current generated when one of the key switches is closed and outputting a first data signal indicative thereof; and
   a comparison circuit, including a first input tied to a second terminal of each one of the second plurality of N key switches and a second input electrically connected to the first voltage line, the comparison circuit being capable of outputting a second data signal responsive to the comparison of the first input and the second input.

* * * * *

UNITED STATES PATENT AND TRADEMARK OFFICE
CERTIFICATE OF CORRECTION

PATENT NO. : 6,424,274 B1
DATED : July 23, 2002
INVENTOR(S) : Schnizlein et al.

It is certified that error appears in the above-identified patent and that said Letters Patent is hereby corrected as shown below:

Column 2,
Line 25, delete "generated" and insert -- generating --
Line 34, delete "alow" and insert -- allow --
Line 65, delete "fist" and insert -- first --

Signed and Sealed this

Nineteenth Day of November, 2002

Attest:

JAMES E. ROGAN
Attesting Officer   Director of the United States Patent and Trademark Office